US010819360B2

(12) United States Patent
Nakamura et al.

(10) Patent No.: US 10,819,360 B2
(45) Date of Patent: Oct. 27, 2020

(54) DELTA-SIGMA MODULATOR, DELTA-SIGMA MODULATION TYPE A/D CONVERTER AND INCREMENTAL DELTA-SIGMA MODULATION TYPE A/D CONVERTER

(71) Applicant: DENSO CORPORATION, Kariya, Aichi-pref. (JP)

(72) Inventors: Kunihiko Nakamura, Kariya (JP); Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/594,587

(22) Filed: Oct. 7, 2019

(65) Prior Publication Data

US 2020/0153446 A1    May 14, 2020

(30) Foreign Application Priority Data

Nov. 13, 2018  (JP) ................................ 2018-213000

(51) Int. Cl.
*H03M 1/06* (2006.01)
*H03M 1/36* (2006.01)
*H03M 1/12* (2006.01)

(52) U.S. Cl.
CPC ....... *H03M 1/0678* (2013.01); *H03M 1/1245* (2013.01); *H03M 1/365* (2013.01)

(58) Field of Classification Search
CPC ... H03M 1/0678; H03M 1/1245; H03M 1/365
USPC .............................................. 341/135–155
See application file for complete search history.

(56) References Cited

U.S. PATENT DOCUMENTS

| 6,384,758 | B1 * | 5/2002 | Michalski ............ G11C 27/026 327/94 |
| 6,466,153 | B1 * | 10/2002 | Yu ....................... H03M 1/0673 341/120 |
| 8,073,894 | B1 * | 12/2011 | Dasgupta ............. H03H 19/004 708/819 |

(Continued)

FOREIGN PATENT DOCUMENTS

JP        2014-146893 A        8/2014

OTHER PUBLICATIONS

Andrea Agnes et al., "High-resolution multi-bit second-order incremental converter with 1.5-(mu)V residual offset and 94-dB SFDR", Analog Integrated Circuits and Signal Processing, 2012, vol. 72, No. 3, pp. 531-539, Springer Science+Business Media, LLC.

*Primary Examiner* — Lam T Mai
(74) *Attorney, Agent, or Firm* — Posz Law Group, PLC

(57) ABSTRACT

A ΔΣ modulator includes an input circuit having a sampling capacitor, an integration circuit, a quantizer and a D/A converter having a DAC capacitor. The input circuit takes in an analog input voltage in the sampling capacitor in a sampling period, and transfers a charge to the integration circuit in a holding period. The D/A converter takes in an analog potential, to which selection switches are connected in the sampling period based on a digital output of the quantizer, in the DAC capacitor, and subtracts a charge from the integration circuit in the holding period. At this time, since the input circuit and the D/A converter are set so that the holding periods do not overlap with each other, an error caused by the lowering of a feedback factor is suppressed.

8 Claims, 7 Drawing Sheets

(56) References Cited

U.S. PATENT DOCUMENTS

| | | | | |
|---|---|---|---|---|
| 2007/0285296 A1* | 12/2007 | Bilhan | ............... | H03M 1/0629 |
| | | | | 341/155 |
| 2010/0188277 A1* | 7/2010 | Aruga | ................. | H03M 1/1215 |
| | | | | 341/158 |
| 2012/0313668 A1* | 12/2012 | Moldsvor | ........... | H03M 1/1245 |
| | | | | 327/94 |
| 2013/0162455 A1* | 6/2013 | Mateman | ............. | G11C 27/026 |
| | | | | 341/122 |
| 2015/0022387 A1* | 1/2015 | Chang | .................... | H03M 3/37 |
| | | | | 341/143 |
| 2015/0084798 A1* | 3/2015 | Nezuka | ................. | H03M 1/001 |
| | | | | 341/143 |
| 2018/0212616 A1* | 7/2018 | Nezuka | ................. | H03M 3/454 |
| 2019/0363731 A1* | 11/2019 | Nezuka | ................. | H03M 3/496 |
| 2020/0112318 A1* | 4/2020 | Nakamura | ............ | H03M 1/361 |
| 2020/0162093 A1* | 5/2020 | Nakamura | ............ | H03M 1/802 |

\* cited by examiner

… … …

DELTA-SIGMA MODULATOR, DELTA-SIGMA MODULATION TYPE A/D CONVERTER AND INCREMENTAL DELTA-SIGMA MODULATION TYPE A/D CONVERTER

CROSS REFERENCE TO RELATED APPLICATION

The present application claims the benefit of priority from Japanese Patent Application No. 2018-213000 filed on Nov. 13, 2018. The entire disclosure of the above application is incorporated herein by reference.

FIELD

The present disclosure relates to a ΔΣ modulator, ΔΣ modulation type A/D converter, and incremental ΔΣ modulation type A/D converter, which are used for A/D conversion.

BACKGROUND

In a conventional ΔΣ modulation type A/D converter, an analog input voltage is sampled by a sampling capacitor, and a charge of the charged sampling capacitor is transferred to an integration capacitor connected between input and output terminals of an amplifier. A DAC capacitor is provided in a portion where a D/A converter outputs an analog voltage as a result of quantization of an output voltage of the amplifier.

The analog voltage is generated by the DAC capacitor, and the charge corresponding to the generated voltage is subtracted from the charge accumulated in the integration capacitor. By repeating such processing, quantization is repeated to acquire a digital output.

SUMMARY

The present disclosure provides a ΔΣ modulator, which comprises an input circuit, a D/A converter, an integration circuit, a quantizer and a control circuit. The input circuit is configured to store a charge corresponding to an analog input voltage in a sampling capacitor in a sampling period thereof and transfer the charge of the sampling capacitor in a holding period thereof. The D/A converter is configured to store a charge, which corresponds to one of a plurality of analog potentials, in a DAC capacitor in a sampling period thereof in accordance with a quantization result and transfer the charge of the DAC capacitor in a holding period thereof. The integration circuit is configured to integrate the charge stored in the input circuit and the charge stored in the D/A converter. The quantizer is configured to quantize an output of the integration circuit. The control circuit is configured to control the sampling periods and the holding periods of the input circuit and the D/A converter based on the quantization result of the quantizer.

DETAILED DESCRIPTION OF THE EMBODIMENT

First Embodiment

Hereinafter, the present disclosure will be described with reference to a first embodiment shown in FIG. 1 and FIG. 2.

Figure 1:
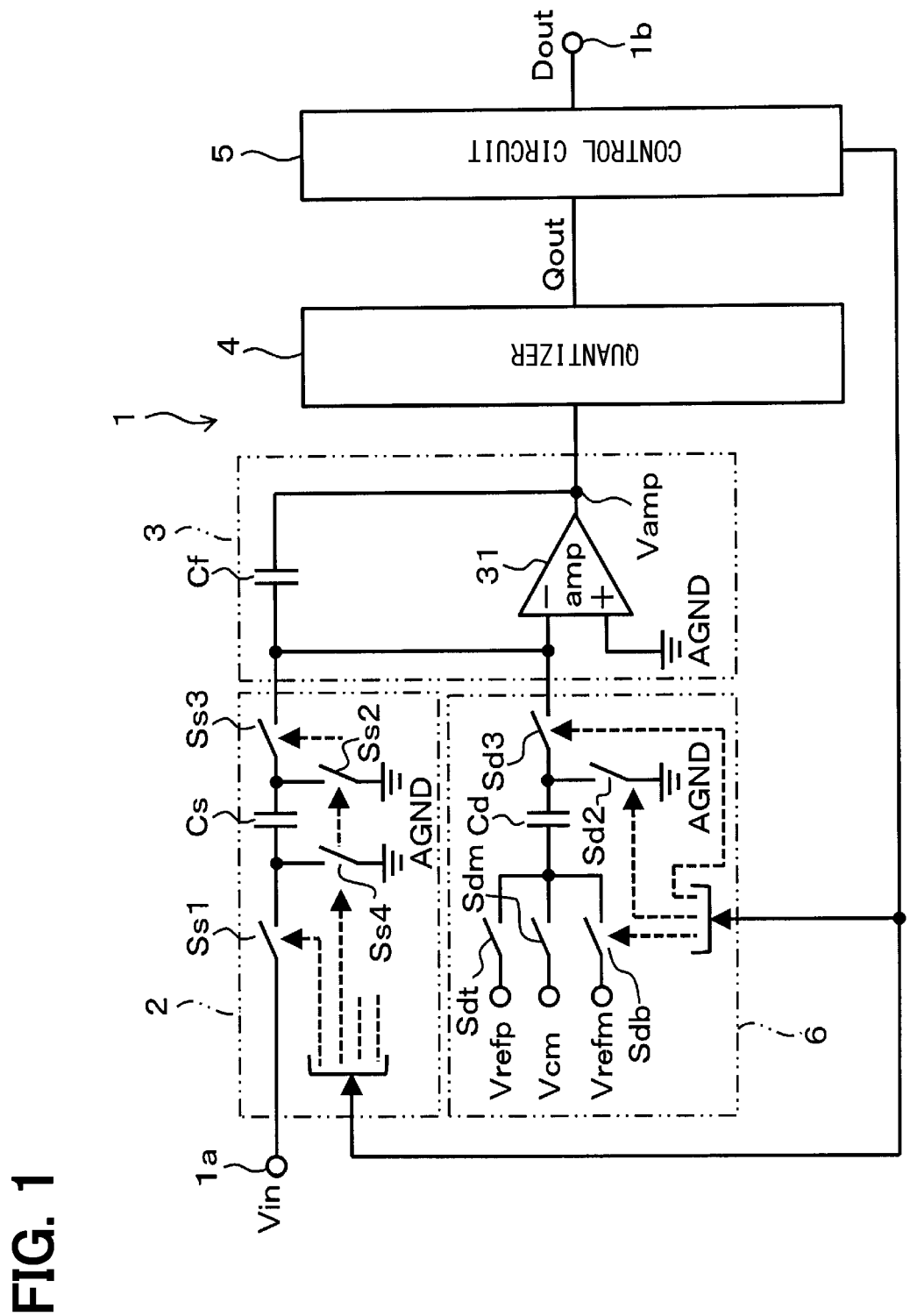
FIG. 1 is an electrical configuration diagram showing a first embodiment.

In FIG. 1, a ΔΣ modulator 1 has an input terminal 1a for an analog input voltage Vin and an output terminal 1b for a digital signal output Dout. The ΔΣ modulator 1 includes an input circuit 2, an integration circuit 3, a quantizer 4, a control circuit 5 and a D/A converter 6.

The input circuit 2 includes a sampling capacitor Cs and four switches Ss1 to Ss4. The input terminal 1a is connected to the integration circuit 3 through the switch Ss1, the sampling capacitor Cs and the switch Ss3, which are connected in series. Input and output sides of the sampling capacitor Cs are connected to an analog ground AGND (hereinafter simply referred to as AGND) through the switches Ss4 and Ss2, respectively. On/off operations of the four switches Ss1 to Ss4 are controlled by the control circuit 5.

In this case, the control circuit 5 controls a sampling operation and a holding operation of the sampling capacitor Cs. The control circuit 5 specifically turns on the switches Ss1 and Ss2 and turns off the switches Ss3 and Ss4 in the sampling operation. The control circuit 5 turns off the switches Ss1 and Ss2 and turns on the switches Ss3 and Ss4 in the holding operation.

The integration circuit 3 includes an amplifier 31 and an integration capacitor Cf, which is a feedback capacitor. An inverting input terminal of the amplifier 31 is connected to the switch Ss3 of the input circuit 2 and is connected to the output terminal through the integration capacitor Cf. A non-inverting input terminal of the amplifier 31 is connected to AGND.

The quantizer 4 internally includes a comparator. The quantizer 4 receives an analog output Vamp output from the amplifier 31 of the integration circuit 3, compares the analog output Vamp with a threshold voltage, and outputs a determination result, that is, a quantization result Qout, to the control circuit 5. The control circuit 5 outputs a control signal corresponding to the quantization result Qout to the D/A converter 6 described later, and outputs a ΔΣ modulation result Dout according to a result of integrating the quantization result Qout.

The D/A converter 6 includes a DAC capacitor Cd and five switches Sdt, Sdm, Sdb, Sd2 and Sd3.

The D/A converter 6 also has three analog potentials Vrefp, Vcm and Vrefm as reference potentials. Normally, Vcm is set to AGND, Vrefp is set to a potential higher than AGND, and Vrefm is set to a potential lower than AGND. When AGND is 0V, Vrefp and Vrefm are set to satisfy an equation Vrefp=−Vrefm, that is, absolute values are equal and polarities are opposite to each other. The switches Sdt, Sdm and Sdb function as selection switches, and connect Vrefp, Vcm and Vrefm to inputs of the DAC capacitor Cd.

An output side of the DAC capacitor Cd is connected to the AGND through the switch Sd2, and the output side of the DAC capacitor Cd is connected to an intermediate point between the inverting input terminal of the amplifier 31 and the feedback capacitor Cf through the switch Sd3. The on/off operations of the five switches Sdt, Sdm, Sdb, Sd2 and Sd3 are controlled by the control circuit 5.

In this case, the control circuit 5 controls a sampling operation and a holding operation of the DAC capacitor Cd based on the control signal corresponding to the quantization result output from the quantizer 4. In the sampling operation, the control circuit 5 turns on the switch Sd2 and turns on either one of the selection switches Sdt, Sdm and Sdb, which are selection switches. In the holding operation, the control circuit 5 turns on the switch Sd3 while turning off the switch Sd2, and turns on either one of the switches Sdt, Sdm and Sdb.

Next, an operation of the configuration described above will be described with further reference to FIG. 2.

Figure 2:
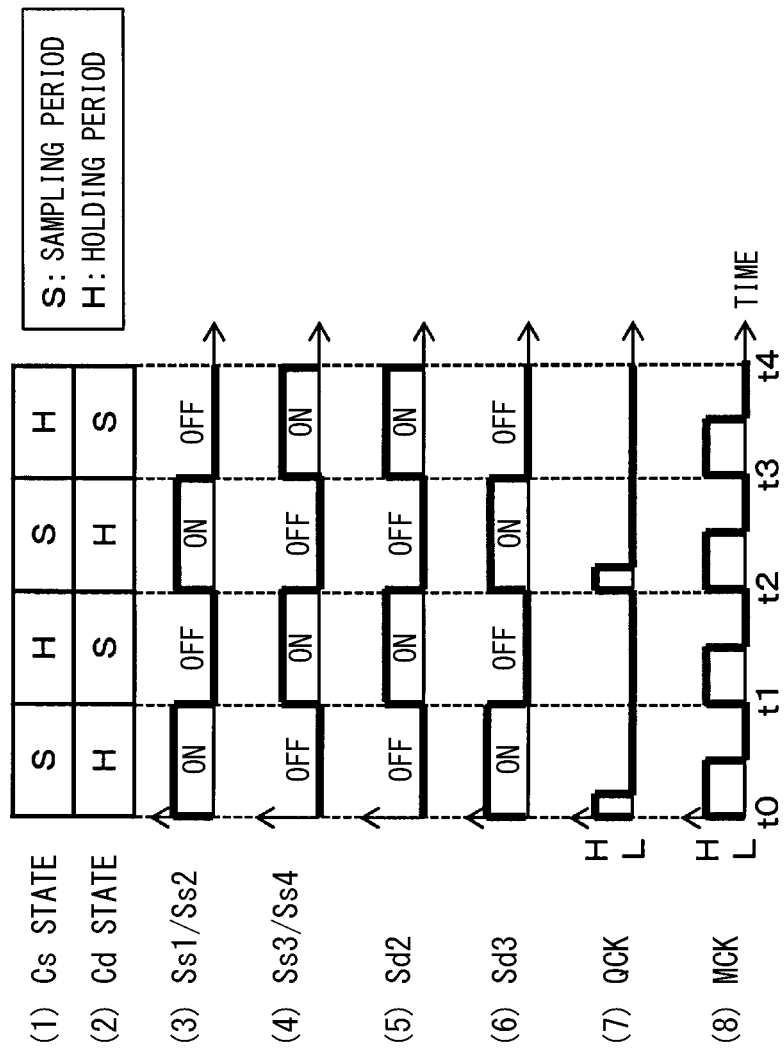
FIG. 2 is a time chart showing an operation of the first embodiment.

In FIG. 2, (1) and (2) show a sampling period S and a holding period H as periods of operation states of the sampling capacitor Cs and the DAC capacitor Cd. In FIG. 2, (3) to (6) show on/off states of various switches. Further, in FIG. 2, (7) shows a state of a quantization clock QCK, and (8) shows a state of a clock MCK of A/D conversion.

At the time when the quantization clock QCK rises to a high level, the quantizer 4 executes a quantization process and outputs the quantization result Qout. Further, the clock MCK for A/D conversion sets a minimum control period of the sampling period and the holding period, and performs timing setting at times t0, t1 and so on at the rising time of each cycle.

As basic contents of A/D conversion processing, as shown in (1) of FIG. 2, the sampling is performed to take in the analog input voltage Vin input to the input terminal 1a into the sampling capacitor Cs in the sampling period S (t0 to t1), and holding is performed to transfer the charge corresponding to the input signal Vin accumulated in the sampling capacitor Cs in the holding period H (t1 to t2) to the integration capacitor Cf. In the input circuit 2, the sampling operation and the holding operation described above are alternately performed.

At this time, in case of performing the sampling operation to the sampling capacitor Cs, the control circuit 5 turns on the switches Ss1 and Ss2 and turns off the switches Ss3 and Ss4 at time t0 as shown in (3) and (4) in FIG. 2. As a result, the input side of the sampling capacitor Cs is connected to the input terminal 1a and the output side of the same is connected to AGND. Thus, the sampling capacitor Cs is charged by the analog input voltage Vin.

The control circuit 5 turns on the switches Ss3 and Ss4 and turns off the switches Ss1 and Ss2 at time t1 in performing the holding operation. Thus, the input side of the sampling capacitor Cs is connected to AGND, and the output side of the same is connected to the non-inverting input terminal of the amplifier 31 of the integration circuit 3. A terminal voltage of the sampling capacitor Cs is input to the amplifier 31.

On the other hand, the control circuit 5 alternately performs the sampling operation and the holding operation on the DAC capacitor Cd as shown in (2) of FIG. 2. At this time, in the sampling operation in the sampling period S, the control circuit 5 turns on the switch Sd2 and holds the switch Sd3 in the off state at time t1 as shown in (5) and (6) of FIG. 2.

At the same time, the control circuit 5 turns on one of the selection switches Sdt, Sdm and Sdb. Thereby, the input side of the DAC capacitor Cd is connected to either one of Vrefp, Vrefm and Vcm, and the output side is connected to AGND. The DAC capacitor Cd is charged by the potential of the connected voltage.

In the holding operation performed in the holding period H, the control circuit 5 turns off the switch Sd2 and turns on the switch Sd3 at time t2 as shown in (5) and (6) of FIG. 2. At the same time, the control circuit 5 turns on one of the selection switches Sdt, Sdm and Sdb. As a result, the input side of the DAC capacitor Cd is connected to one of Vrefp, Vrefm and Vcm, and the output side is connected to the inverting input terminal of the amplifier 31 of the integration circuit 3. The terminal voltage of the DAC capacitor Cd is input to the amplifier 31.

At this time, the D/A converter 6 is enabled to output multiple levels of analog potentials to the inverting input terminal by combining Vrefp, Vrefm and Vcm, which are selected by the selection switches Sdt, Sdm and Sdb, in the sampling period S and the holding period H, respectively.

It is noted in the present embodiment that the control circuit 5 controls the holding period H in the input circuit 2 and the holding period H in the D/A converter 6 do not overlap in terms of time.

As shown in (1) and (8) of FIG. 2, the sampling period S and the holding period H for the sampling capacitor Cs correspond to each cycle of the clock MCK. Further, as shown in (2) and (8) of FIG. 2, the sampling period S and the holding period H for the DAC capacitor Cd correspond to the period of one cycle of the clock MCK.

The quantization clock QCK outputs pulses that rise at times t0 and t2. Thereby, the quantization process is performed by the quantizer 4 at times t0 and t2, and quantized data is output.

As described above, since control of each holding period H is performed by the control circuit 5, it is possible to avoid inputting of two different voltages to the inverting input terminal of the amplifier 31 of the integration circuit 3 at the same time from both of the input circuit 2 and the D/A converter 6. As a result, it is avoided that the sampling capacitor Cs and the DAC capacitor Cd are electrically connected to the inverting input terminal of the amplifier 31 at the same time.

According to the present embodiment, the control circuit 5 is configured to control the holding periods H in the input circuit 2 and the D/A converter 6 not to overlap with each other in respect of time. It is therefore possible to avoid lowering of the accuracy which is otherwise caused by lowering of a feedback factor.

It is noted that, in a comparison example in which the holding period H of the sampling capacitor Cs and the holding period H of the DAC capacitor Cd are assumed to be the same and the sampling capacitor Cs, the DAC capacitor Cd and the integration capacitor Cf are simultaneously connected, the feedback factor is lowered and an amplifier gain is lowered, resulting in lowering of calculation accuracy. In this case, the feedback factor in the holding period H under a state of overlapping of the holding periods H is expressed as the following equation (1) in which Cf, Cd and Cs indicate capacitances of the integration capacitor Cf, the DAC capacitor Cd and the sampling capacitor Cs, respectively.

$$Cf/(Cf+Cd+Cs) \quad (1)$$

According to the present embodiment, the sampling capacitor Cs and the DAC capacitor Cd are not electrically connected directly in the holding period H. As a result, lowering of the accuracy caused by the lowering of the feedback factor is avoided. Under a state of no overlapping of the holding periods H of the sampling capacitor Cs, the feedback factor in the holding period H is expressed as the following equation (2) and the feedback factor in the holding period H of the DAC capacitor Cd is expressed as the following equation (3).

$$Cf/(Cf+Cs) \quad (2)$$

$$Cf/(Cf+Cd) \quad (3)$$

As a result, the feedback factor can be made larger in case of no overlapping of the holding periods H than in case of overlapping in the comparison example, and a gain of an amplifier which is proportional to the feedback factor can also be made larger.

In the present embodiment, the switch Ss1 and the switch Ss2 of the D/A converter 6 are tuned on and off in the same phase and in the synchronized manner. However, the timings of turning on and off need not be completely the same but may be slightly different. The timings of turning on and off of the switches Ss3 and Ss4 may also be slightly different.

Further, the switch Ss1 and the witch Ss2, and the switch Ss3 and the switch Ss4 are operated to turn on and off oppositely, that is, in the reversed manner, to each other. However, for instance, the switch Ss1 and the switch Ss4 connected to one end of the sampling capacitor Cs or the switch Ss2 and the switch Ss3 connected to the other end of the sampling capacitor Cs may be turned off simultaneously for a certain period at the time of transition between turning on and off. Similarly, although the switches Sd2 and Sd3 operate to turn on and off oppositely, that is, in the reversed manner, both of these switches Sd2 and Sd3 may be turned off simultaneously for a certain period at the time of switching.

Second Embodiment

Figure 3:
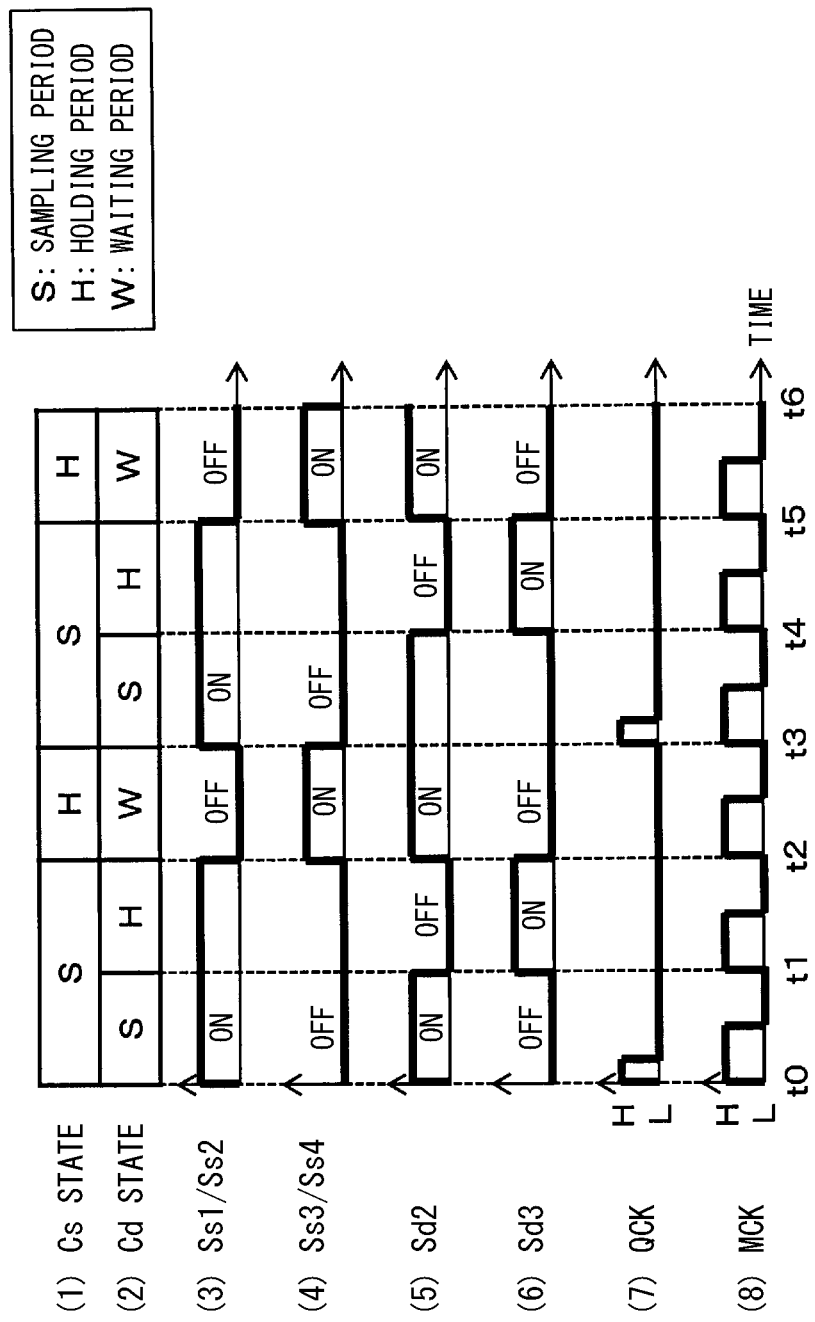
FIG. 3 is a time chart showing an operation of a second embodiment.

FIG. 3 shows a second embodiment. Its differences from the first embodiment will be described below. In the present embodiment, in addition to the sampling period S and the holding period H set by the control circuit 5, a waiting period W in which none of the sampling operation and the holding operation are performed is set to adjust the holding periods H in the input circuit 2 and the D/A converter 6 not to overlap in time. With this waiting period W, different control is performed.

As opposed to the first embodiment in which the sampling operation and the holding operation in the input circuit 2 and the D/A converter 6 are controlled to be executed in two cycles of the clock MCK, the sampling operation and the holding operation are executed once in three cycles of the clock MCK in the present embodiment.

As shown in (1) and (8) of FIG. 3, the sampling period S (t0 to t2) for the sampling capacitor Cs corresponds to a period of two cycles of the clock MCK. The holding period H (t2 to t3) corresponds to a period of one cycle of the clock MCK.

Further, as shown in (2) and (8) of FIG. 3, the sampling period S (t0 to t1), the holding period H (t1 to t2) and the waiting period W (t2 to t3) for the DAC capacitor Cd are set in this order. Each period corresponds to the period of one cycle of the clock MCK.

In this case, the control circuit 5 turns off the selection switches Sdt and Sdb and turns on the switch Sdm in the waiting period W (t2-t3) following the holding period H. The switches Sd2 and Sd3 turn on the switch Sd2 and turn off the switch Sd3 in the same manner as in the sampling operation. Thus, both the input and output sides of the DAC capacitor Cd are connected to AGND, and the charge is reset.

Also, at this time, the quantization clock QCK is output as a high level pulses at the start of each cycle, that is, at time t0 and t3. Therefore, at each of times t0 and t3, the quantization process is performed by the quantizer 4 and the quantized data is output at time t0 and t3.

Thus, in the second embodiment, the sampling period S of the input circuit 2 is set to a period twice as long as the period set in the first embodiment, and the sampling period S and the holding period H in the D/A converter 6 are set in the doubled sampling period of the input circuit 2. In the holding period H of the input circuit 2, the D/A converter 6 is set to be in the waiting period W.

Therefore, in the second embodiment as well, the same effect as those of the first embodiment can be provided. Further, since a sufficient sampling time can be secured in the input circuit 2, the required specifications for the pre-stage driver circuit will be mitigated.

Third Embodiment

Figure 4:
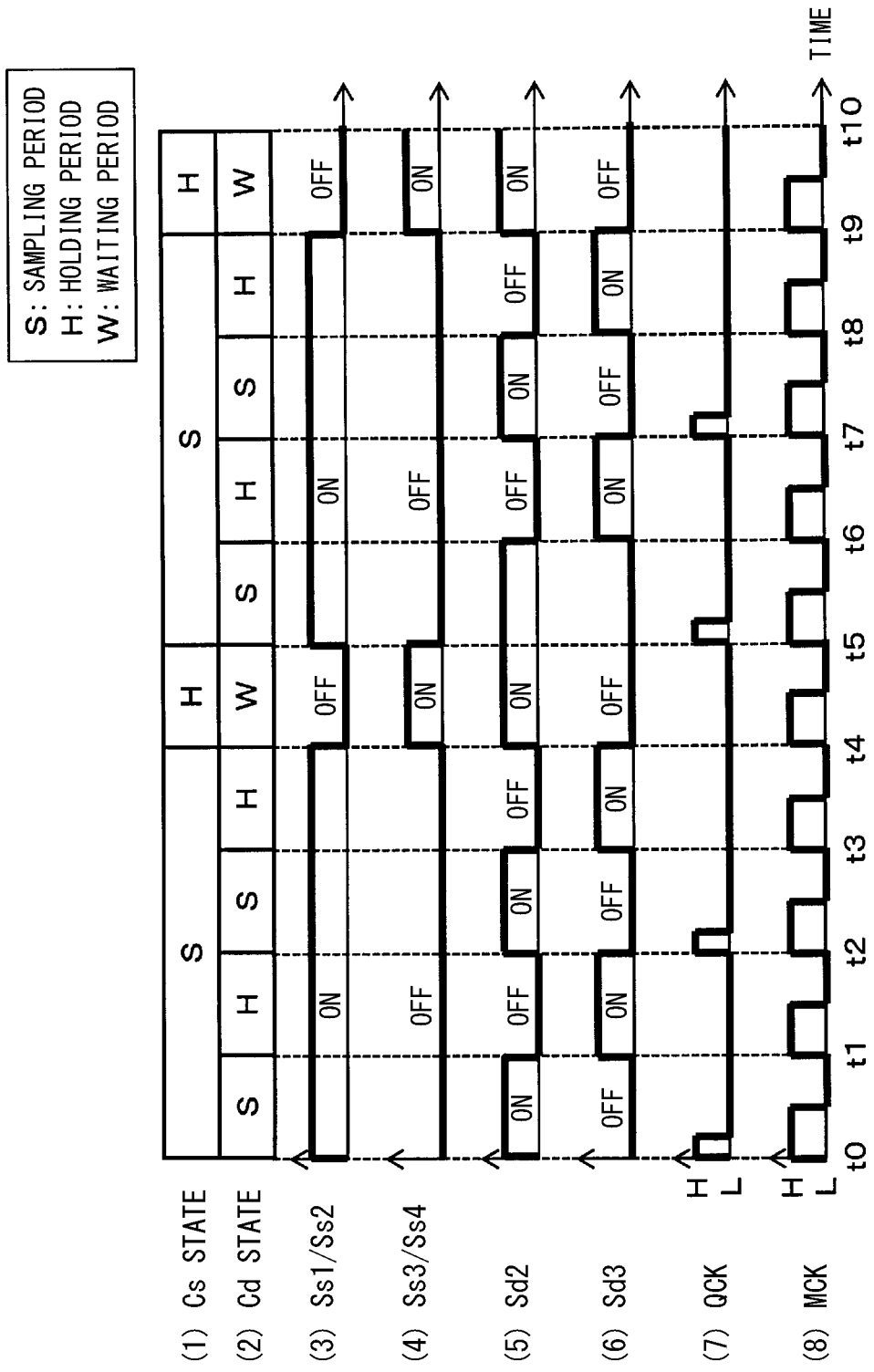
FIG. 4 is a time chart showing an operation of a third embodiment.

FIG. 4 shows a third embodiment. Its differences from the second embodiment will be described below. In the present embodiment, the sampling period S (t0 to t4) of the input circuit 2 is set to a period of 4 cycles of the clock MCK while it is set to 2 cycles in the second embodiment.

As shown in (1) and (8) of FIG. 4, the sampling period S (t0 to t4) for the sampling capacitor Cs corresponds to a period of four cycles of the clock MCK. The holding period H (t4 to t5) corresponds to a period of one cycle of the clock MCK.

Further, as shown in (2) and (8) of FIG. 4, the D/A converter 6 repeats twice the operations of the sampling period S (t0 to t1, t2 to t3) and the holding period H (t1 to t2, t3 to t4) for the DAC capacitor Cd in correspondence to the sampling period S (t0 to t4) of the input circuit 2. Further, in response to the holding period H (t4 to t5) of the input circuit 2, the waiting period W (t4 to t5) is set.

In this case, the control circuit 5 of the D/A converter 6 turns off the selection switches Sdt and Sdb and turns on the selection switch Sdm in the waiting period W (t4 to t5) following the holding period H. The switch Sd2 is turned on and the switch Sd3 is turned off in the same manner as in the sampling operation. Thus, both the input and output sides of the DAC capacitor Cd are connected to AGND, and the charge is reset.

Also, at this time, the quantization clock QCK is output as the high level pulse at the start time of the sampling period S of the input circuit 2, that is, time t0 and time t2 in the sampling period. Therefore, at each time t0 and t2, the quantization process is performed by the quantizer 4 and the quantized data is output at time t0 and t2.

Thus, in the third embodiment, the sampling period S of the input circuit 2 is set to a period twice as long as the period set in the second embodiment, and the sampling period S and the holding period H in the D/A converter 6 are set repeatedly, that is, twice, in the sampling period S of the input circuit 2. In the holding period H of the input circuit 2, the D/A converter 6 is set to be in the waiting period W.

Therefore, in the third embodiment as well, the same effect as that of the second embodiment can be provided. Further, since a plurality of feedbacks can be executed by the D/A converter 6 for one sampling, the feedback of the quantization result can be maintained at high speed and the resolution of the ΔΣ modulator 1 can be enhanced even if the operation speed of the driver is relatively slow.

Fourth Embodiment

Figure 5:
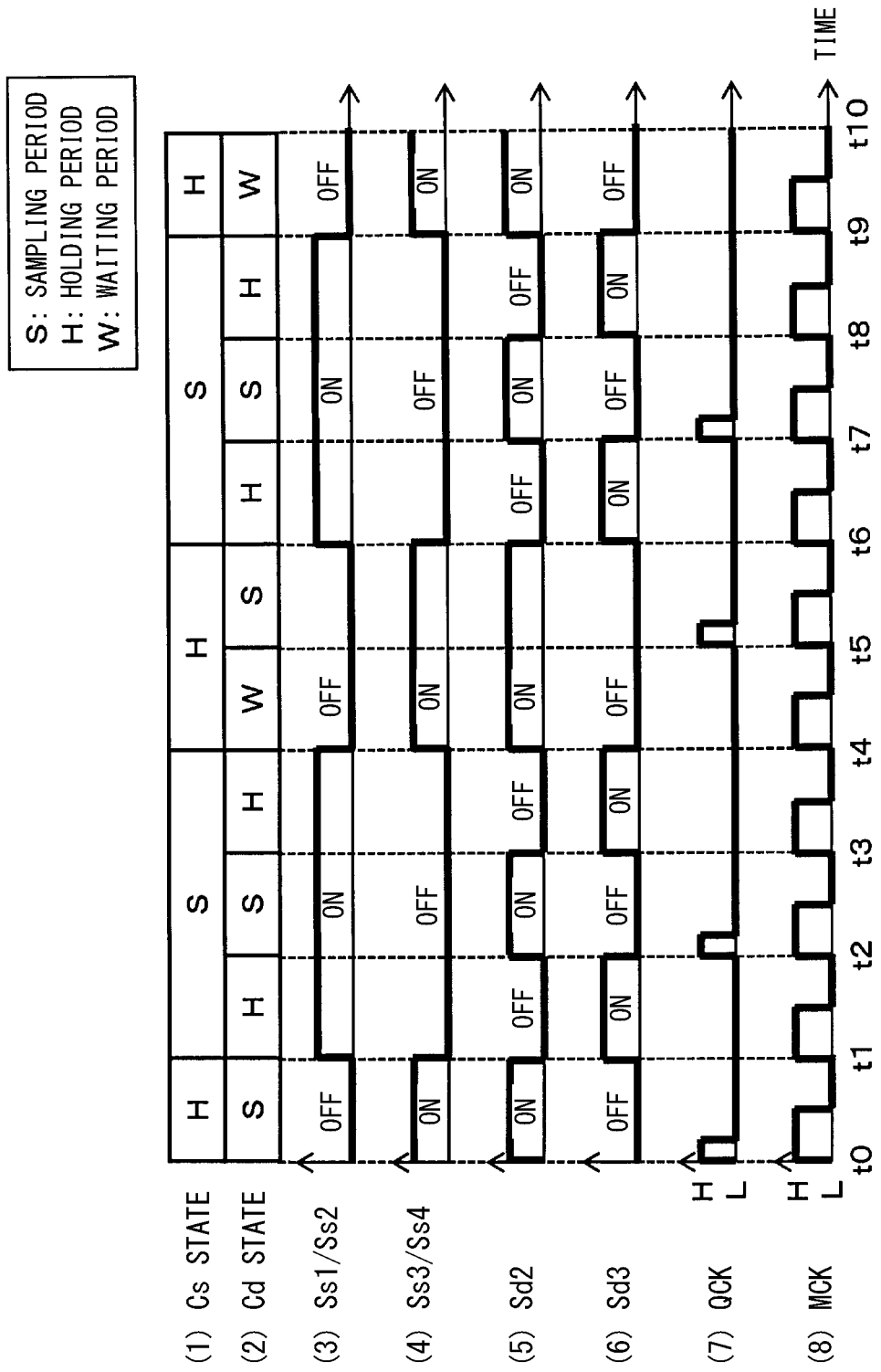
FIG. 5 is a time chart showing an operation of a fourth embodiment.

FIG. 5 shows a fourth embodiment. Its differences from the third embodiment will be described below. In the third embodiment described above, the sampling period S of the input circuit 2 is set to be four cycles of the clock MCK. In the present embodiment, however, the holding period H of the preceding cycle is extended in the initial period (t0 to t1) of one cycle of the clock MCK in the sampling period.

As shown in (1) and (8) of FIG. 5, the holding period H (t0 to t1) is set prior to the sampling period S (t1 to t4). This holding period H continues from the preceding cycle. The sampling period S (t1 to t4) for the sampling capacitor Cs corresponds to a period of three cycles of the clock MCK. Further, the holding period H (t4 to t6) corresponds to a period of two cycles of the clock MCK following the sampling period S. The second half (t5 to t6) of the holding period H is a period corresponding to the first holding period H (t0 to t1).

Further, as shown in (2) and (8) of FIG. 5, the sampling period S (t0 to t1) is set for the DAC capacitor Cd in the D/A converter 6 in correspondence to the holding period H (t0 to t1) of the input circuit 2. Further, the holding period H (t1 to t2, t3 to t4) and the sampling period S (t2 to t3) are set for the DAC capacitor Cd in the D/A converter 6 in correspondence to the sampling period S (t1 to t4) of the input circuit 2. The waiting period W (t4 to t5) and the sampling period S (t5 to t6) are set in correspondence to the holding period H (t4 to t6) of the input circuit 2.

As described above, in the fourth embodiment, the sampling period S of the input circuit 2 is set shorter by one cycle for the first portion of the period set in the third embodiment, This shortened period is used for the holding period H so that the holding period is extended to two cycles of the clock MCK. As a result, the transfer time of the charge of the sampling capacitor Cs in the input circuit 2 can be secured.

Therefore, in the fourth embodiment as well, the same effect as in the third embodiment can be provided. In the input circuit 2, the holding period H can be secured while securing the sampling period S.

Fifth Embodiment

Figure 6:
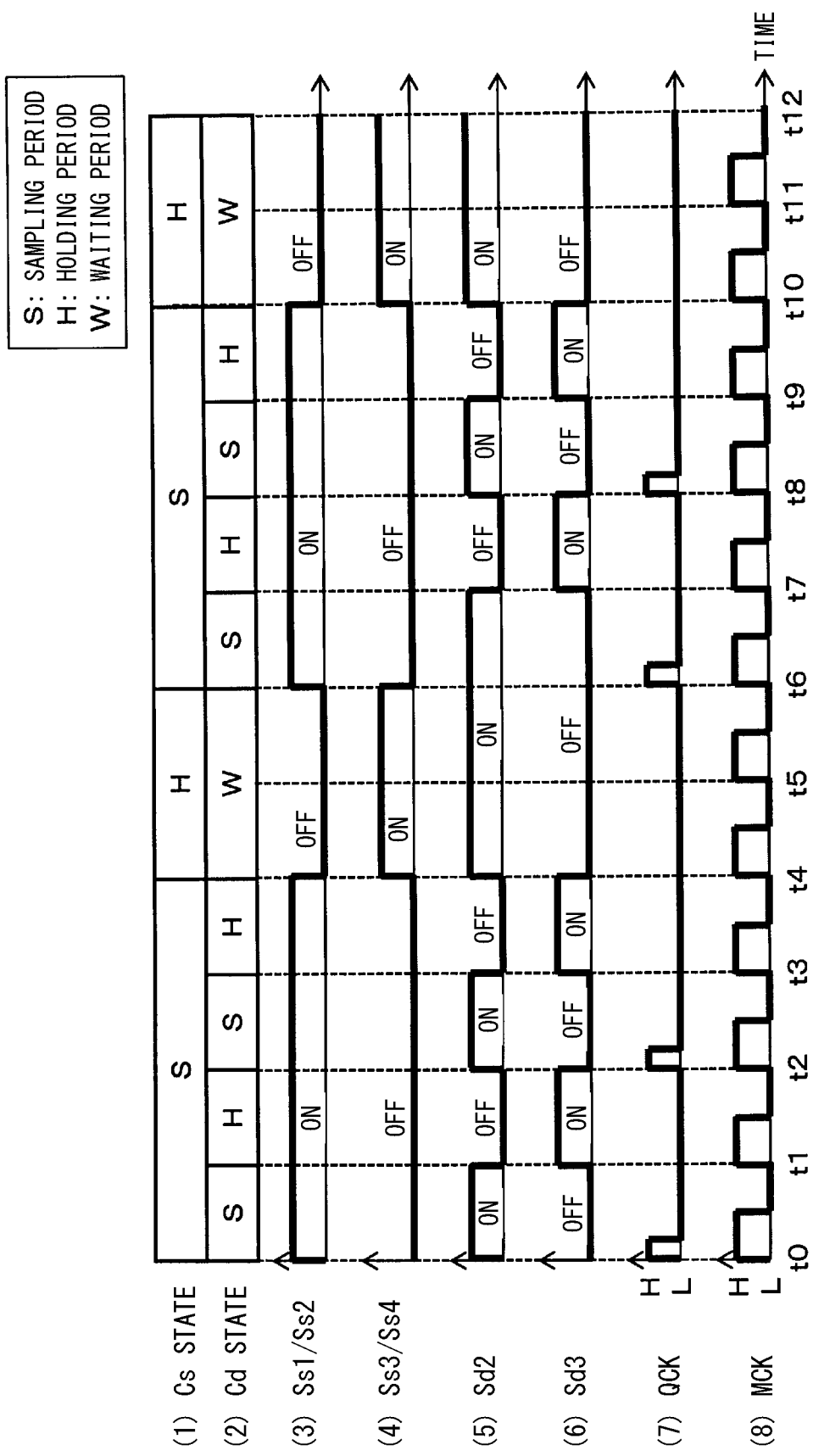
FIG. 6 is a time chart showing an operation of a fifth embodiment.

FIG. 6 shows a fifth embodiment. Its differences from the third embodiment will be described below. In the present embodiment, the holding period H in the input circuit 2 is set to be extended to two cycles of the clock MCK as compared with the one cycle of the clock MCK in the third embodiment.

As shown in (1) and (8) of FIG. 6, the sampling period S (t0 to t4) for the sampling capacitor Cs corresponds to a period of four cycles of the clock MCK similarly to the third embodiment.

Further, as shown in (2) and (8) of FIG. 6, the D/A converter 6 repeats twice the operations of the sampling period S (t0 to t1, t2 to t3) and the holding period H (t1 to t2, t3 to t4) for the DAC capacitor Cd in correspondence to the sampling period S (t0 to t4) of the input circuit 2.

On the other hand, the holding period H (t4 to t6) of the input circuit 2 is set to a period twice that of the holding period H in the third embodiment, that is, a period corresponding to two cycles of the clock MCK. Further, the waiting period W (t4 to t6) is set in correspondence to the holding period H (t4 to t6) of the input circuit 2. That is, the waiting period W is also set to a period twice as long as the waiting period W set in the third embodiment.

As described above, in the fifth embodiment, the sampling period S is set long, and the holding period H is also set long in the input circuit 2.

Therefore, in the fifth embodiment as well, the same effect as in the third embodiment can be provided. That is, the holding period H can be secured in the input circuit 2, while securing the sampling period S. As a result, the transfer time of the charge of the sampling capacitor Cs in the input circuit 2 can be secured.

Further, in the fifth embodiment, an operation of one cycle including the sampling period S and the holding period H of the input circuit 2 is set as a cycle of an even multiple (2n times) of the clock MCK. As a result, a logic circuit for generating a control signal for setting the period can be easily configured.

Sixth Embodiment

Figure 7:
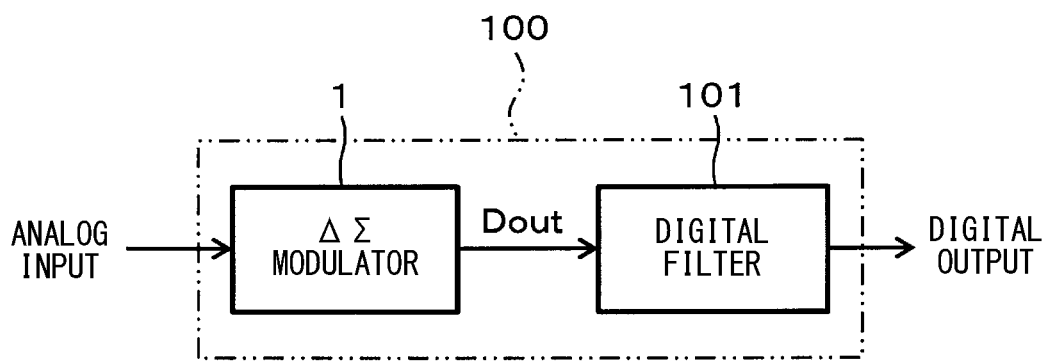
FIG. 7 is an electrical configuration diagram showing a sixth embodiment.

FIG. 7 shows a sixth embodiment which is applied to a ΔΣ modulation type A/D converter 100. In this embodiment, the ΔΣ modulation type A/D converter 100 is configured using the ΔΣ modulator 1 shown in the first to fifth embodiments described above. The ΔΣ modulation type A/D converter 100 includes a digital filter 101 that processes the output signal Dout of the ΔΣ modulator 1.

With this configuration, the digital signal Dout of the ΔΣ modulation result, which is the output of the ΔΣ modulator 1 described in each of the above embodiments, is processed by the digital filter 101 located in the subsequent stage of the ΔΣ modulator as in a general ΔΣ modulator. Thus, the A/D conversion can be performed.

Seventh Embodiment

Figure 8:
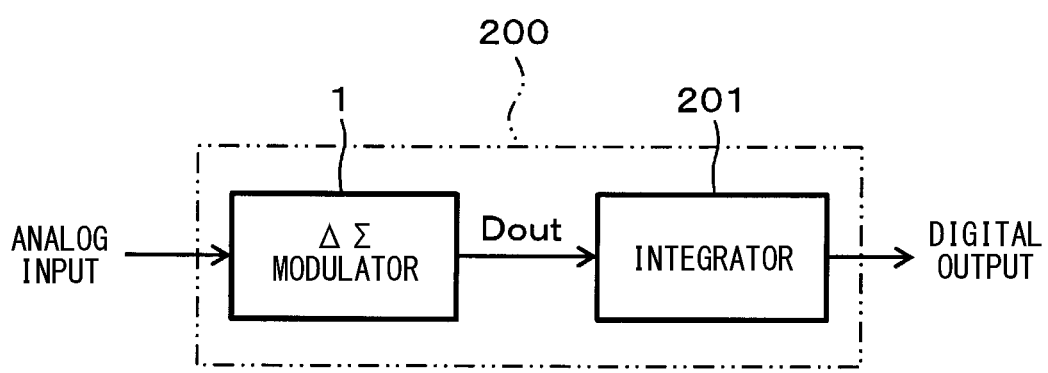
FIG. 8 is an electrical configuration diagram showing a seventh embodiment.

FIG. 8 shows a seventh embodiment which is applied to an incremental ΔΣ modulation type A/D converter 200. In this embodiment, the ΔΣ modulation type A/D converter 200 is configured using the ΔΣ modulator 1 described in the first to fifth embodiments described above. In the incremental ΔΣ modulation type A/D converter 200, an integrator 201 configured of a number of digital circuits corresponding to the order of the ΔΣ modulator 1 is located at the subsequent stage of the ΔΣ modulator 1.

With this configuration, it is possible to operate as the incremental ΔΣ modulation type A/D converter 200 by temporarily resetting an integrator 201 configured of the integration circuit 3 of the ΔΣ modulator 1 and the digital circuit and then operating the integrator 201 for a predetermined period.

Other Embodiment

The present disclosure should not be limited to the embodiments described above, and various embodiments may further be implemented without departing from the scope of the present disclosure. For example, the embodiments may be modified or expanded as described below.

In the third and fifth embodiments, the sampling period S and the holding period H of the D/A converter 6 are set to two cycles in correspondence to the sampling period S of the input circuit 2. However, these periods may be set to three or more cycles.

In the fifth embodiment, the holding period H of the input circuit 2 is set to two cycles of the clock MCK. However, this holding period may be set to three or more cycles of the clock MCK. In this modification, the waiting period W of the D/A converter 6 may be set similarly, and the sampling period S may be set in addition to the waiting period W as in the fourth embodiment.

In each of the embodiments and modifications described above, the circuit configuration is assumed to be a single-ended type, but the present disclosure may also be applied to a differential type.

Although the present disclosure has been described in accordance with the embodiments, it is understood that the present disclosure is not limited to such embodiments or structures. The present disclosure covers various modification examples and equivalent modifications.

What is claimed is:

1. A ΔΣ modulator comprising:
   an input circuit configured to store a charge corresponding to an analog input voltage in a sampling capacitor in a sampling period thereof and transfer the charge of the sampling capacitor in a holding period thereof;
   a D/A converter configured to store a charge, which corresponds to one of a plurality of analog potentials, in a DAC capacitor in a sampling period thereof in accordance with a quantization result;
   an integration circuit configured to integrate the charge stored in the input circuit and the charge stored in the D/A converter;
   a quantizer configured to quantize an output of the integration circuit; and
   a control circuit configured to control the sampling periods and the holding periods of the input circuit and the D/A converter based on the quantization result of the quantizer and transfer the charge of the DAC capacitor in a holding period thereof,
   wherein the control circuit is configured to control the holding period of the input circuit and the holding period of the D/A converter not to overlap with each other.

2. The ΔΣ modulator according to claim 1, wherein:
   the control circuit is configured to control a sampling operation and a subsequent holding operation of the D/A converter in the sampling period of the input circuit, and control a waiting operation of the D/A converter in the holding period of the input circuit.

3. The ΔΣ modulator according to claim 2, wherein:
   the control circuit is configured to control the D/A converter to perform the sampling operation and the subsequent holding operation a plurality of times in the sampling period of the input circuit.

4. The ΔΣ modulator according to claim 3, wherein:
   the control circuit is configured to extend the holding period of the input circuit to overlap the sampling period of the D/A converter, and set the sampling period of the input circuit to start from the holding period of the D/A converter.

5. The ΔΣ modulator according to claim 2, wherein:
   the control circuit is configured to set the holding period of the input circuit and the waiting period of the D/A converter to correspond to a plural number of the sampling periods or the holding periods of the D/A converter.

6. The ΔΣ modulator according to claim 1, wherein:
   the control circuit is configured to set one cycle, which is formed of the sampling period and the holding period of the input circuit, to an even number of minimum control periods, each of the minimum control periods being equal to the sampling period or the holding period of the D/A converter.

7. A ΔΣ modulation type A/D converter comprising:
   the ΔΣ modulator according to claim 1.

8. An incremental ΔΣ modulation type A/D converter comprising:
   the ΔΣ modulator according to claim 1.

* * * * *